United States Patent
Chen et al.

(10) Patent No.: US 12,494,384 B1
(45) Date of Patent: Dec. 9, 2025

(54) CHIP DEFECT MODIFYING DEVICE AND METHOD

(71) Applicant: China Electronic Product Reliability And Environmental Testing Research Institute, Guangzhou (CN)

(72) Inventors: Yiqiang Chen, Guangzhou (CN); Yichi Zhang, Guangzhou (CN); Chang Liu, Guangzhou (CN)

(73) Assignee: China Electronic Product Reliability And Environmental Testing Research Institute, Guangzhou (CN)

( * ) Notice: Subject to any disclaimer, the term of this patent is extended or adjusted under 35 U.S.C. 154(b) by 0 days.

(21) Appl. No.: 19/054,779

(22) Filed: Feb. 15, 2025

(30) Foreign Application Priority Data

Jun. 5, 2024 (CN) .......................... 202410720074.6

(51) Int. Cl.
*H01L 21/67* (2006.01)
*H01L 21/30* (2006.01)

(52) U.S. Cl.
CPC .... *H01L 21/67017* (2013.01); *H01L 21/3003* (2013.01); *H01L 21/67098* (2013.01); *H01L 21/67253* (2013.01)

(58) Field of Classification Search
CPC .......... H01L 21/67017; H01L 21/3003; H01L 21/67098; H01L 21/67253
See application file for complete search history.

(56) References Cited

U.S. PATENT DOCUMENTS

| | | | |
|---|---|---|---|
| 4,113,514 A * | 9/1978 | Pankove | H10D 62/40 |
| | | | 438/798 |
| 4,473,597 A * | 9/1984 | Pankove | H01L 21/314 |
| | | | 257/E23.122 |

(Continued)

FOREIGN PATENT DOCUMENTS

| | | | | |
|---|---|---|---|---|
| BR | PI1010569 B1 | * 10/2019 | ........ | H01L 21/31116 |
| CA | 2761905 C | * 11/2017 | .......... | C23C 16/045 |

(Continued)

OTHER PUBLICATIONS

China Institute of Electronic Product Reliability and Environmental Testing (Applicant), Replacement claims (allowed) of CN202410720074.6, Jul. 15, 2024.

(Continued)

*Primary Examiner* — Mohammed Shamsuzzaman
(74) *Attorney, Agent, or Firm* — Zhigang Ma

(57) ABSTRACT

A chip defect modifying device and a chip defect modifying method allow carbon dioxide to be in a supercritical state, enhance a passivation effect of hydrogen on the chip, heat a surface of the chip with microwaves emitted by a microwave module, and further promote a diffusion of hydrogen molecules and atoms in the chip. Sound waves emitted by the ultrasonic module act with a supercritical fluid of the carbon dioxide, causing cavitation of the supercritical fluid, which promotes the diffusion of hydrogen molecules and atoms in the chip. An activator is added to adsorb the hydrogen molecules, which adsorb onto metal positions on a surface of platinum, thereby forming hydrogen atoms and achieving a decomposition of the hydrogen molecules. The number of the hydrogen atoms increases, which promotes a formation of covalent bonds between the hydrogen atoms and atoms in the chip, and thereby enhancing the passivation effect.

3 Claims, 2 Drawing Sheets

(56) References Cited

U.S. PATENT DOCUMENTS

| | | | | |
|---|---|---|---|---|
| 6,239,067 | B1* | 5/2001 | Palacios | C01B 32/336 |
| | | | | 502/180 |
| 6,689,284 | B1* | 2/2004 | Nakasaki | B08B 7/00 |
| | | | | 438/707 |
| 6,875,709 | B2* | 4/2005 | Lin | H01L 21/76826 |
| | | | | 438/782 |
| 7,695,567 | B2* | 4/2010 | Fu | H01L 21/02063 |
| | | | | 134/1.2 |
| 11,101,141 | B2* | 8/2021 | Chang | H10D 12/031 |
| 2006/0210469 | A1* | 9/2006 | Moriya | C01B 7/191 |
| | | | | 423/481 |
| 2012/0196445 | A1* | 8/2012 | Lim | B81C 1/00928 |
| | | | | 156/345.29 |
| 2017/0323768 | A1* | 11/2017 | Zhang | H01J 37/32082 |
| 2020/0161094 | A1* | 5/2020 | Zhang | H01J 37/32467 |

FOREIGN PATENT DOCUMENTS

| | | | | | |
|---|---|---|---|---|---|
| CN | 112151384 | A | * | 12/2020 | H10D 8/051 |
| CN | 111446154 | B | * | 5/2023 | H10D 1/66 |
| JP | H04260330 | A | * | 9/1992 | C23C 16/045 |
| JP | H1060656 | A | * | 3/1998 | H01L 21/31116 |
| JP | H11168097 | A | * | 6/1999 | H01L 21/31116 |
| JP | 2000124195 | A | * | 4/2000 | H01L 21/02063 |
| JP | 2001168076 | A | * | 6/2001 | H01L 21/31116 |
| WO | WO-0022660 | A1 | * | 4/2000 | H01L 21/31116 |

OTHER PUBLICATIONS

CNIPA, Notification to grant patent right for invention in CN202410720074.6, Jul. 22, 2024.

* cited by examiner

CHIP DEFECT MODIFYING DEVICE AND METHOD

CROSS-REFERENCE TO RELATED APPLICATION

This application claims priority to Chinese Patent Application No. 202410720074.6, filed Jun. 5, 2024, which is herein incorporated by reference in its entirety.

TECHNICAL FIELD

The disclosure relates to the field of chip defect modification, and particularly to a chip defect modifying device and a chip defect modifying method.

BACKGROUND

A growth process of chip materials inevitably produces defects, leading to a poor chip performance. It is necessary to modify/repair a chip by permeating hydrogen into nanostructures of the chip, repairing internal defects and material defects without destroying microstructures of the chip, thereby enhancing performance and stability of the chip.

Aiming to the above technical problem, passivation of the chip is required. As referring to the European patent application with publication No. EP0419693A1 discloses a hydrogen passivation of silicon in a hydrogen atmosphere through a heat treatment. A method in the disclosure only promotes a diffusion of hydrogen gas within a chip through a high temperature, and it cannot decompose hydrogen molecules to produce hydrogen atoms. The number of the hydrogen atoms is low, resulting in a limited number of covalent bonds formed between the hydrogen atoms and chip atoms, thereby leading to an incomplete passivation effect.

The Chinese patent with application No. 202010374301.6, published on May 16, 2023, discloses a 4H-SiC/SiO$_2$ interface low-temperature improvement method based on a supercritical CO$_2$ treatment and its application. The method uses a supercritical fluid to carry water molecules into an oxide and an interface, and oxide traps and interface states are passivated at a low temperature. The method utilizes a large diffusion coefficient of the supercritical fluid to accelerate a diffusion speed of the water molecules, and makes oxygen carried in deionized water to be reacted with metals to form oxide. However, the method cannot decompose the water molecules, nor can it utilize newly produced oxygen from decomposition of the water molecules to interact with the oxide, resulting in an incomplete passivation effect. The above-mentioned two methods only accelerate the diffusion speed of molecules within a sample and cannot decompose the molecules, which fail to promote an interaction between the molecules and the sample.

SUMMARY

In view of this, the purpose of the disclosure is to provide a chip defect modifying device (also referred to as chip defect repair) and a chip defect modifying method that allow carbon dioxide to be a supercritical state, enhance a passivation effect of hydrogen on a chip, heat a surface of the chip with microwaves emitted by a microwave module, and further promote a diffusion of hydrogen molecules and atoms in the chip. Sound waves emitted by the ultrasonic module act with a supercritical fluid of the carbon dioxide, causing cavitation of the supercritical fluid of the carbon dioxide, which promotes the diffusion of hydrogen molecules and atoms in the chip. An activator is added to adsorb the hydrogen molecules, which adsorb onto metal positions on a surface of platinum, thereby forming hydrogen atoms and achieving a decomposition of the hydrogen molecules. The number of the hydrogen atoms increases, which promotes a formation of covalent bonds between the hydrogen atoms and atoms in the chip, and thereby enhancing the passivation effect.

To solve above problems, the technical solutions of the disclosure are as follow.

A chip defect modifying device includes a reactor, a heating module, a microwave module, an ultrasonic module, a carbon dioxide gas source, a modifying gas source, and a vacuuming apparatus. The vacuuming apparatus is connected to the reactor, and the vacuuming apparatus is configured to extract gas from the reactor. The carbon dioxide gas source is connected to the reactor, and the carbon dioxide gas source is configured to introduce carbon dioxide into the reactor. The modifying gas source is connected to the reactor, and the modifying gas source is configured to introduce hydrogen gas or hydrogen isotope gas into the reactor. The heating module is connected to the reactor, and the heating module is configured to heat the reactor. The microwave module is connected to the reactor, and the microwave module is configured to heat a chip in the reactor. The ultrasonic module is connected to the reactor, and the ultrasonic module is configured to cause a supercritical fluid of the carbon dioxide in the reactor to vibrate.

In an embodiment, the chip defect modifying device further includes an atmosphere detection module, and the atmosphere detection module is configured to detect a gas concentration in the reactor.

In an embodiment, the chip defect modifying device further includes a pressure detection module, and the pressure detection module is configured to detect a value of pressure in the reactor.

In an embodiment, both the microwave module and the ultrasonic module are disposed outside the reactor, an emission end of the microwave module and an emission end of the ultrasonic module both extend into an interior of the reactor. Both the microwave module and the ultrasonic module are sealingly connected to the reactor, and the heating module is located at a bottom of the reactor.

In an embodiment, during an operation of the chip defect modifying device, after placing the chip and an activator into the reactor, firstly, the vacuuming apparatus is activated to evacuate the reactor, then the carbon dioxide and one of the hydrogen gas and the hydrogen isotope gas are sequentially introduced into the reactor. The heating module heats the reactor to make the carbon dioxide in the reactor to be in a supercritical state, the microwave module heats the chip, and the ultrasonic module causes a supercritical fluid of the carbon dioxide in the reactor to vibrate, a preset duration is maintained to passivate the chip.

The disclosure further provides a chip defect modifying method, which uses the chip defect modifying device according to any one of above embodiments to modify the chip. The chip defect modifying method includes steps as follows.

S1, the chip and the activator are placed in the reactor, and then the reactor is vacuumed.

S2, the carbon dioxide is introduced into the reactor.

S3, the hydrogen gas or the hydrogen isotope gas is introduced into the reactor to mix the hydrogen gas or the hydrogen isotope gas with the carbon dioxide.

S4, the reactor is heated by the heating module to make the carbon dioxide in the reactor be in the supercritical state.

S5, the chip is heated by the microwave module, and the ultrasonic module makes the supercritical fluid of the carbon dioxide in the reactor vibrate.

S6, the heating module, the microwave module, and the ultrasonic module are turned off, and the pressure in the reactor is reduced to atmospheric pressure.

S7, the chip is taken out.

In an embodiment, a frequency of the microwave module is in a range of 300 Megahertz (MHz)-3000 MHz, and a frequency of the ultrasonic module is in a range of 20 kilohertz (kHz)-200 kHz.

In an embodiment, an amount of the carbon dioxide introduced is (100%-X %) $p_0$, and in step S3, an amount of the hydrogen gas or the hydrogen isotope gas introduced is X % $p_0$, where $p_0$ represents a preset room temperature pressure.

In an embodiment, the hydrogen gas or the hydrogen isotope gas introduced into the reactor is mixed uniformly with the carbon dioxide in step S3 before proceeding the step S4.

In an embodiment, the method further includes that, before the step S4, whether a concentration of the hydrogen gas or the hydrogen isotope gas in the reactor meets a standard (i.e., a target concentration) is detected.

Compared with the related art, main advantages of the chip defect modifying device described in the disclosure are reflected in the following aspects. The device uses the hydrogen gas or the hydrogen isotope gas for passivation treatment of the chip. The vacuuming apparatus is used to evacuate the reactor, thereby removing excess gases from the reactor and ensuring a reliability of the passivation effect. The hydrogen gas or the hydrogen isotope gas introduced into the reactor is used to interact with the chip, and the carbon dioxide introduced into the reactor serves as the supercritical fluid. The heating module is used to heat the reactor, thereby making the carbon dioxide in the reactor to be in the supercritical state, which enhances the passivation effect of the hydrogen gas or the hydrogen isotope gas on the chip.

The hydrogen gas is taken as an example, the microwave module and the ultrasonic module interact with the chip. Microwaves emitted by the microwave module further heat a surface of the chip, which further promotes the diffusion of the hydrogen molecules and the hydrogen atoms within the chip. Sound waves emitted by the ultrasonic module interact with the supercritical fluid of the carbon dioxide to cause cavitation of the supercritical fluid of the carbon dioxide, which promotes the diffusion of the hydrogen molecules and the hydrogen atoms in the chip. Both the microwave module and the ultrasonic module further enhance the passivation effect.

Compared with the related art, beneficial effects of a chip defect modifying method described in the disclosure are mainly reflected in the following aspects. The activator is platinum, which adsorbs the hydrogen gas molecules or the hydrogen isotope gas molecules to form the hydrogen atoms or the hydrogen isotope atoms. The hydrogen gas is taken as an example, by adding the carbon dioxide as a supercritical fluid, the large diffusion coefficient of the supercritical fluid can accelerate a diffusion speed of the hydrogen molecules and the atoms in the chip. In addition, advantages of high solubility and high permeability of the supercritical fluid are taken, the supercritical fluid carries the hydrogen atoms into the interior of the chip, which allows the hydrogen atoms to act on both the surface and the interior of the chip, thereby enhancing the passivation effect.

The platinum is added as a catalyst, the platinum can adsorb the hydrogen molecules, which adsorb the hydrogen molecules onto metal sites on a surface of platinum, thereby forming the hydrogen atoms, achieving the decomposition of the hydrogen molecules. Therefore, the number of the hydrogen atoms is increased and a formation of covalent bonds between the hydrogen atoms and the atoms in the chip is promoted, which enhances the passivation effect.

The microwaves emitted by the microwave module further heat the surface of the chip, which further promotes the diffusion of the hydrogen molecules and the hydrogen atoms in the chip. The sound waves emitted by the ultrasonic module interact with the supercritical fluid of the carbon dioxide, causing cavitation of the supercritical fluid of the carbon dioxide, which promotes the diffusion of the hydrogen molecules and the hydrogen atoms in the chip. Simultaneously, under the combined action of the microwave module and the ultrasonic module, the heating of the chip is accompanied by an acceleration of the diffusion of the hydrogen molecules and the hydrogen atoms in the chip, thereby further enhancing the passivation effect.

In addition, before the passivation, the hydrogen gas is mixed with the carbon dioxide, it is ensured that the hydrogen gas is uniformly distributed in the reactor, with consistent concentrations across different areas of the reactor, which makes the passivation of the chip by the hydrogen gas reliable and effective. Following the mixing of the hydrogen gas with the carbon dioxide, the concentration of the hydrogen gas in the reactor is then detected to determine whether it is uniformly distributed, ensuring the reliability of the hydrogen passivation on the chip.

The disclosure facilitates the diffusion of the hydrogen molecules and the hydrogen atoms in the chip for the first time using the supercritical fluid, for the second time by heating the chip with the microwave module, and for the third time through the action of the sound waves emitted by the ultrasonic module on the supercritical fluid of the carbon dioxide, causing cavitation of the supercritical fluid, which further promotes the diffusion of the hydrogen molecules and the hydrogen atoms in the chip.

BRIEF DESCRIPTION OF DRAWINGS

Through concrete embodiments of the disclosure shown in the attached drawings, the above and other objectives, features, and advantages of the disclosure will become clearer. The same reference numerals in all the attached drawings indicate the same parts, and the attached drawings are not intentionally scaled proportionally according to actual dimensions. The focus is on illustrating the essence of the disclosure.

Figure 1:
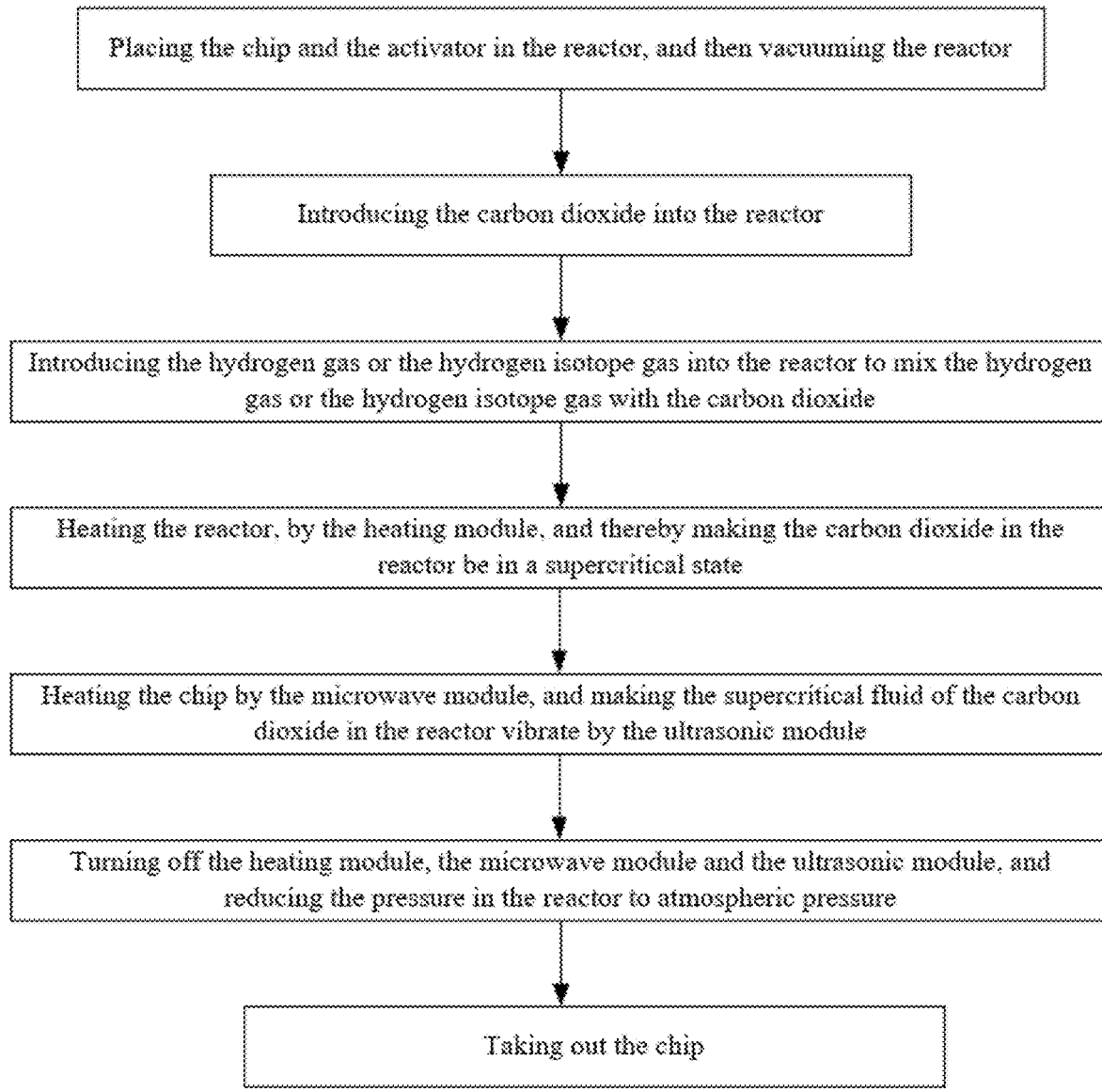
FIG. 1 illustrates a flowchart of a method according to the disclosure.

DESCRIPTION OF REFERENCE NUMERALS 1. reactor; 2. heating module; 3. vacuum valve; 4. vacuuming apparatus; 5. atmosphere detection module; 6. pressure detection module; 7. first inflation pump; 8. first control valve; 9. second inflation pump; 10. second control valve; 11. carbon dioxide gas source; 12. modifying gas source; 13. air release valve; 14. microwave module; 15. ultrasonic module.

DETAILED DESCRIPTION OF EMBODIMENTS

The following description, in conjunction with the attached drawings and the specific embodiment, further details the technical solution of the disclosure to enable those skilled in the art to better understand and implement the disclosure. However, the examples provided are not intended to limit the disclosure. In the embodiment, terms such as "longitudinal," "transverse," "up," "down," "front," "back," "left," "right," "vertical," "horizontal," "top," "bottom," "inside," "outside," etc., which indicate the direction or positional relationships, are based on the orientation or position shown in the attached drawings. These terms are used solely for the purpose of describing the disclosure and do not indicate or imply that the devices or components must have specific orientations or be constructed and operated in a specific orientation. Therefore, they should not be construed as limiting the scope of the disclosure.

It should be noted that when a component is "connected" to another component, it can be directly connected to another component and integrated with it, or there may be a central component present at the same time. The terms "install", "an end", "another end" and similar expressions used in the disclosure are for illustrative purposes only.

Figure 2:
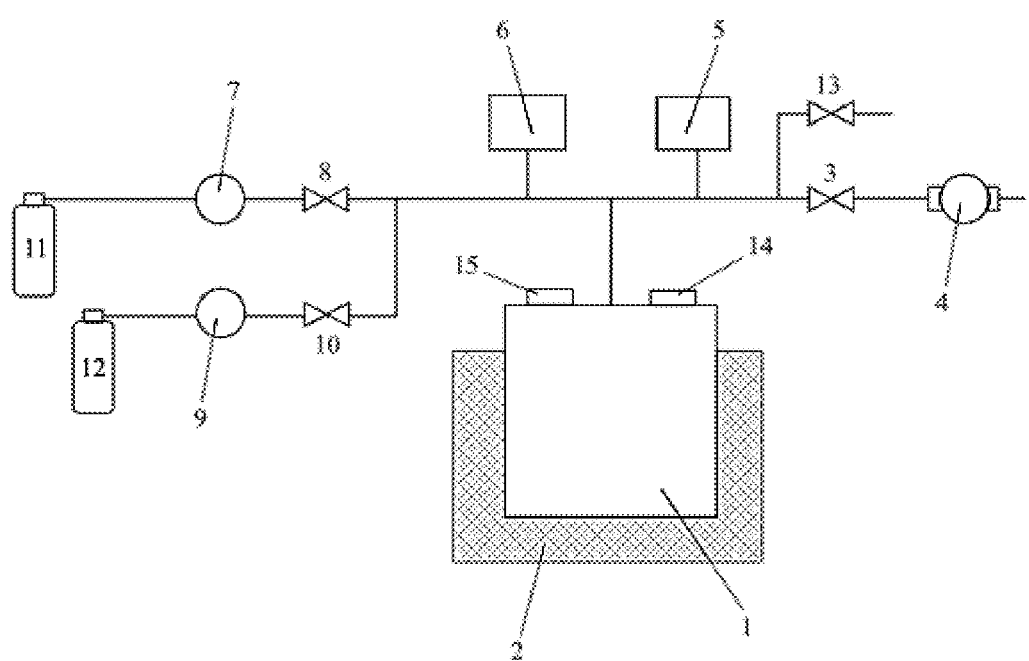
FIG. 2 illustrates a schematic diagram of a device according to the disclosure.

As shown in FIGS. 1-2, a chip defect modifying device includes a reactor (e.g., reaction kettle) 1, a heating module (also referred to as heater) 2 connected to the reactor 1, an atmosphere detection module (also referred to as atmosphere detector) 5, a pressure detection module (also referred to as pressure detector) 6, a microwave module (also referred to as microwave generator) 14, an ultrasonic module (also referred to as ultrasonic generator) 15, a carbon dioxide gas source 11, a modifying gas source 12, and a vacuuming apparatus 4. The vacuuming apparatus 4 is configured (i.e., structured and arranged) to extract gas from the reactor, and the carbon dioxide gas source 11 is configured to introduce carbon dioxide into the reactor 1. The modifying gas source 12 is configured to introduce hydrogen gas or hydrogen isotope gas into the reactor 1. The atmosphere detection module 5 is configured to detect a gas concentration in the reactor 1. The pressure detection module 6 is configured to detect a value of pressure in the reactor 1. The heating module 2 is configured to heat the reactor 1. The microwave module 14 is configured to heat a chip in the reactor 1. The ultrasonic module 15 is configured to cause a supercritical fluid of the carbon dioxide inside the reactor 1 to vibrate. The device passivates the chip using the hydrogen or hydrogen isotopes.

In an illustrated embodiment, the modifying gas source 12 is configured to introduce hydrogen gas into the reactor 1.

It should be noted that the heating module 2 can heat the reactor 1 as long as it is in contact with the reactor 1. In an illustrated embodiment, the heating module 2 is disposed at the bottom of the reactor 1. The microwave module 14 and the ultrasonic module 15 are disposed outside the reactor 1, an emission end of the microwave module 14 and an emission end of the ultrasonic module 15 both extend into an interior of the reactor 1. Both the microwave module 14 and the ultrasonic module 15 are sealingly connected to the reactor 1. In an illustrated embodiment, the microwave module 14 and the ultrasonic module 15 are disposed on a top of the reactor 1.

In an illustrated embodiment, the vacuuming apparatus 4 is a vacuum pump. The carbon dioxide gas source 11 is a carbon dioxide cylinder. The modifying gas source 12 is a hydrogen cylinder. The chip defect modifying device also includes a first inflation pump 7, a first control valve 8, a second inflation pump 9, a second control valve 10, a vacuum valve 3, and an air release valve 13. The carbon dioxide gas source 11 is connected to the first inflation pump 7, and the first inflation pump 7 is connected to the reactor 1 via the first control valve 8. The modifying gas source 12 is connected to the second inflation pump 9, and the second inflation pump 9 is connected to the reactor 1 via the second control valve 10. The vacuuming apparatus 4 is connected to the reactor 1 through the vacuum valve 3. The reactor 1 is also connected to the air release valve 13.

The vacuuming apparatus 4 is used to evacuate the reactor 1 to remove excess gases from the reactor 1, ensuring a reliability of the passivation effect. The hydrogen gas introduced into the reactor 1 is used to interact with the chip, and the carbon dioxide introduced into the reactor 1 serves as a supercritical fluid. The heating module 2 heats the reactor 1 to make the carbon dioxide to be in a supercritical state, thereby enhancing the passivation effect of the hydrogen gas on the chip. In addition, the microwave module 14 and the ultrasonic module 15 interact with the chip. Microwaves emitted by the microwave module 14 further heat the surface of the chip, thereby promoting the diffusion of the hydrogen molecules and the hydrogen atoms in the chip. Sound waves emitted by the ultrasonic module 15 interact with the supercritical fluid of the carbon dioxide, thereby causing cavitation of the supercritical fluid of the carbon dioxide, which promotes the diffusion of the hydrogen molecules and the hydrogen atoms in the chip. Both the microwave module 14 and the ultrasonic module 15 further enhance the passivation effect.

In an illustrated embodiment, a power of the microwave module 14 is in a range of 100 watts (W)-5000 W, and a frequency of the microwave module 14 is in a range of 300 MHz-3000 MHz. A power of the ultrasonic module 15 is in a range of 100 W-3000 W, and a frequency of the ultrasonic module 15 is in a range of 20 kHz-200 kHz. Upper limits of the power and the frequency for the microwave module 14 are set to prevent excessively high power and frequency from damaging the chip. Lower limits of the power and the frequency for the microwave module 15 are set to ensure that the power and frequency are not too low, guaranteeing an effective impact on the chip.

A chip defect modifying method includes steps as follows.

S1, the chip and the activator are placed in the reactor 1, and then the reactor 1 is vacuumed. In an illustrated embodiment, the activator is platinum.

S1.1, a passivation time, a room temperature pressure $p_0$ inside the reactor 1, and a target temperature for the reactor 1 are pre-set. A concentration of the hydrogen gas at the room temperature pressure $p_0$ is pre-set. In an illustrated embodiment, the room temperature pressure po and the target temperature are a pressure and a temperature at which the carbon dioxide is in a supercritical state.

By setting the room temperature pressure $p_0$ and the target temperature, the method simply and reliably controls the carbon dioxide to be in the supercritical state.

S2, the reactor is introduced with (100%-X %) $p_0$ of the carbon dioxide.

S3, the reactor is introduced with X % $p_0$ of the hydrogen gas to make the room temperature pressure in the reactor 1 reach the preset room temperature pressure po. After the carbon dioxide and the hydrogen gas are mixed uniformly inside the reactor, whether the concentration of the hydrogen gas in the reactor 1 meets a target concentration is detected. if the concentration of the hydrogen gas in the reactor 1 meets the target concentration, step S4 is performed.

S4, the reactor is heated by the heating module to make the carbon dioxide in the reactor be in the supercritical state.

S5, the chip is heated by the microwave module, and the ultrasonic module makes the supercritical fluid of the carbon dioxide in the reactor vibrate.

S6, the heating module, the microwave module, and the ultrasonic module are turned off, and the pressure in the reactor is reduced to atmospheric pressure.

S7, the chip is taken out. Specifically, the chip is removed when the temperature inside reactor 1 drops to the room temperature.

The above method includes passivating the chip with the hydrogen gas. The carbon dioxide is added as a supercritical fluid, the supercritical fluid has a large diffusion coefficient, which accelerates the diffusion of the hydrogen molecules and the hydrogen atoms in the chip. In addition, advantages of the high solubility and high permeability of the supercritical fluid are taken, the supercritical fluid carries the hydrogen atoms into an interior of the chip, which allows the hydrogen atoms to act on both the surface and the interior of the chip, thereby enhancing the passivation effect.

The platinum is added as a catalyst, the platinum can adsorb the hydrogen molecules, which adsorb the hydrogen molecules onto metal sites on a surface of platinum, thereby forming the hydrogen atoms, achieving the decomposition of the hydrogen molecules. Therefore, the number of the hydrogen atoms is increased and a formation of covalent bonds between the hydrogen atoms and the atoms in the chip is promoted, which enhances the passivation effect.

The microwaves emitted by the microwave module 14 further heat the surface of the chip, which further promotes the diffusion of the hydrogen molecules and the hydrogen atoms in the chip. The sound waves emitted by the ultrasonic module interact with the supercritical fluid of the carbon dioxide, causing cavitation of the supercritical fluid of the carbon dioxide, which promotes the diffusion of the hydrogen molecules and the hydrogen atoms in the chip. Simultaneously, under the combined action of the microwave module and the ultrasonic module, the heating of the chip is accompanied by an acceleration of the diffusion of the hydrogen molecules and the hydrogen atoms in the chip, thereby further enhancing the passivation effect.

In addition, before the passivation, the hydrogen gas is mixed with the carbon dioxide, it is ensured that the hydrogen gas is uniformly distributed in the reactor, with consistent concentrations across different areas of the reactor, which makes the passivation of the chip by the hydrogen gas reliable and effective. Following the mixing of the hydrogen gas with the carbon dioxide, the concentration of the hydrogen gas in the reactor is then detected to determine whether it is uniformly distributed, ensuring the reliability of the hydrogen passivation on the chip.

Specifically, the above-mentioned method includes steps as follows.

In the step S1, the vacuum valve 3 is opened and the vacuuming apparatus is activated 4 to evacuate the reactor 1. A vacuum level inside the reactor 1 is detected by a pressure detector, and once a set value of the pressure in the reactor is reached, the vacuum valve 3 is closed and the vacuuming apparatus is deactivated 4.

In the step S2, the first inflation pump 7 and the first control valve 8 are opened, the first inflation pump 7 introduces the carbon dioxide into the reactor 1. The first control valve 8 is a flow control valve that regulates the concentration of carbon dioxide introduced into the reactor 1. After introducing (100%-X %) $p_0$ of the carbon dioxide, the first control valve 8 is closed, and then the first inflation pump 7 is closed.

In the step S3, the second inflation pump 9 and the second control valve 10 are opened. The second inflation pump 9 introduces the hydrogen gas into the reactor 1. The second control valve 10 is a flow control valve that regulates a flow of the hydrogen gas from the second inflation pump 9 into the reactor 1, introducing X % $p_0$ of the hydrogen gas to achieve a pressure of room temperature pressure $p_0$ inside the reactor 1. Then, the second control valve 10 is closed, and the second inflation pump 9 is closed. After the hydrogen gas is uniformly mixed with the carbon dioxide, the atmosphere detection module 5 is used to check/detect whether the concentration of the hydrogen gas inside the reactor 1 has reached a preset/target concentration.

In the step S4, the heating module 2 is turned on to heat the reactor 1. When the temperature of the reactor 1 reaches the target temperature, the heating module 2 continues to heat the reactor 1 to maintain the temperature of reactor 1 at a target stable level (i.e., the target temperature).

In the step S6, the heating module 2, the microwave module 14, and the ultrasonic module 15 are turned off, and the air release valve 13 is opened to reduce the pressure inside reactor 1 to the atmospheric pressure.

The disclosure facilitates the diffusion of the hydrogen molecules and the hydrogen atoms in the chip for the first time using the supercritical fluid, for the second time by heating the chip with the microwave module, and for the third time through using the ultrasonic module to vibrate the supercritical fluid in the chip, which further promotes the diffusion of the hydrogen molecules and the hydrogen atoms in the chip.

In another embodiment, the modifying gas source is used to introduce the hydrogen isotope gas into the reactor, and the hydrogen isotope gas specifically refers to deuterium gas. The modifying gas source is a deuterium gas cylinder.

In the specification, unless otherwise explicitly defined and limited, the term of a first feature being "above" or "below" a second feature can mean that the first and second features are in direct contact, or that the first and second features are in indirect contact through an intermediate medium. Moreover, the terms "on," "above," and "over" in relation to the second feature can mean that the first feature is directly above or diagonally above the second feature, or simply that the first feature is at a higher horizontal level than the second feature. The terms "under," "below," and "beneath" in relation to the second feature can mean that the first feature is directly below or diagonally below the second feature, or simply that the first feature is at a lower horizontal level than the second feature.

In the description of the specification, the reference terms "preferred embodiment," "another embodiment," "further embodiment," "specific example," and the like, indicate that the specific features, structures, materials, or characteristics described in conjunction with that embodiment or example are included in at least one embodiment or example of the disclosure. In the specification, the illustrative expressions of the above terms are not necessarily referring to the same embodiment or example. Moreover, the described specific features, structures, materials, or characteristics can be combined in any suitable manner in any one or more embodiments or examples. Furthermore, without contradiction, those skilled in the art can combine and assemble different embodiments or examples and the features of different embodiments or examples as described in the specification.

Although the embodiments of the disclosure have been shown and described above, it is understood that the above embodiments are exemplary and should not be construed as limiting the scope of protection of the disclosure. Those skilled in the art can modify, replace, and vary the above embodiments within the scope of protection of the disclosure.

What is claimed is:

1. A chip defect modifying device, comprising:
a reactor, a heating module, a microwave module, an ultrasonic module, a carbon dioxide gas source, a modifying gas source, and a vacuuming apparatus;
wherein a chip and an activator are configured to be placed in the reactor, the vacuuming apparatus is connected to the reactor and configured to extract gas from the reactor, the carbon dioxide gas source is connected to the reactor and configured to introduce carbon dioxide into the reactor; the modifying gas source is connected to the reactor and configured to introduce hydrogen gas or hydrogen isotope gas into the reactor; the heating module is connected to the reactor and is disposed on a bottom of the reactor, the heating module is configured to heat the reactor to make the carbon dioxide in the reactor be in a supercritical state; the microwave module is connected to the reactor and configured to heat the chip in the reactor; the ultrasonic module is connected to the reactor and configured to cause a supercritical fluid of the carbon dioxide in the reactor to vibrate by the ultrasonic module; the microwave module and the ultrasonic module both are disposed outside the reactor, an emission end of the microwave module and an emission end of the ultrasonic module both extend into an interior of the reactor; the microwave module and the ultrasonic module both are sealingly connected to the reactor; the activator is platinum, the platinum is configured to adsorb hydrogen gas or hydrogen isotope gas molecules to thereby form hydrogen atoms or hydrogen isotope atoms to form covalent bonds between the hydrogen atoms or the hydrogen isotope atoms and atoms in the chip for enhancing a passivation effect to modify defects of the chip; and
wherein a power of the microwave module is in a range of 100 watts (W)-5000 W, and a frequency of the microwave module is in a range of 300 MHz-3000 MHz and the power of the ultrasonic module is in a range of 100 W-3000 W, and the frequency of the ultrasonic module 15 is in a range of 20 kHz-200 kHz.

2. The chip defect modifying device as claimed in claim 1, further comprising:
an atmosphere detection module, wherein the atmosphere detection module is configured to detect a gas concentration in the reactor.

3. The chip defect modifying device as claimed in claim 1, further comprising:
a pressure detection module, wherein the pressure detection module is configured to detect a value of pressure in the reactor.

* * * * *